(12) United States Patent
Gerber et al.

(10) Patent No.: US 10,901,449 B2
(45) Date of Patent: *Jan. 26, 2021

(54) ELECTRONIC DRIVE CIRCUIT

(71) Applicant: Infineon Technologies Austria AG, Villach (AT)

(72) Inventors: Tobias Gerber, Laschach (AT); Thomas Ferianz, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/714,088

(22) Filed: Dec. 13, 2019

(65) Prior Publication Data

US 2020/0117227 A1 Apr. 16, 2020

Related U.S. Application Data

(63) Continuation of application No. 15/294,041, filed on Oct. 14, 2016, now Pat. No. 10,528,071.

(51) Int. Cl.
*G05F 5/00* (2006.01)
*H03K 17/16* (2006.01)

(52) U.S. Cl.
CPC .............. *G05F 5/00* (2013.01); *H03K 17/163* (2013.01); *H03K 17/164* (2013.01); *H03K 17/166* (2013.01)

(58) Field of Classification Search
CPC ........... G05F 5/00; H02M 1/32; H02M 3/156; H03K 17/164; H03K 17/668; H03K 19/0013; H03K 19/00315; H03K 19/018521; H03K 17/10; H03K 17/102;
(Continued)

(56) References Cited

U.S. PATENT DOCUMENTS

| | | | | |
|---|---|---|---|---|
| 7,741,820 B2 * | 6/2010 | Huang | ................... | H02M 3/156 323/271 |
| 7,876,133 B1 * | 1/2011 | McLaughlin | .. | H03K 19/018521 327/112 |
| 9,661,705 B1 | 5/2017 | Tseng | | |

(Continued)

OTHER PUBLICATIONS

"EiceDRIVER", 2EDN752x / 2EDN852x, Infineon Technologies AG, Data Sheet, Revision 2.3, 2016.

*Primary Examiner* — Patrick C Chen
(74) *Attorney, Agent, or Firm* — Murphy, Bilak & Homilier, PLLC

(57) ABSTRACT

An electronic circuit includes a first input pin configured to receive a first input signal that includes an enable information and at least one operation parameter information, a second input pin configured to receive a second input signal, an output pin, a control circuit configured to generate a drive signal based on the first input signal and the second input signal, an output circuit configured to generate an output signal at the output pin, the enable information includes an enabled state and a disabled state, the control circuit is configured to generate the drive signal in the enabled state and to turn to the electronic circuit off in the disabled state, the at least one operation parameter information includes information about an operational parameter of the output signal, and the output circuit is configured to use the at least one operation parameter information to change the operational parameter of the output signal.

20 Claims, 5 Drawing Sheets

(58) Field of Classification Search
CPC ...... H03K 17/12; H03K 17/122; H03K 17/16; H03K 17/161
See application file for complete search history.

(56) References Cited

U.S. PATENT DOCUMENTS

| | | |
|---|---|---|
| 2004/0085791 A1 | 5/2004 | Lin et al. |
| 2008/0246518 A1* | 10/2008 | Galvano ................. H02M 1/38 327/110 |
| 2010/0033215 A1 | 2/2010 | Fogg et al. |
| 2013/0015887 A1 | 1/2013 | Piselli et al. |
| 2013/0271097 A1 | 10/2013 | Lee et al. |

* cited by examiner

ELECTRONIC DRIVE CIRCUIT

TECHNICAL FIELD

This disclosure in general relates to an electronic circuit, in particular an integrated drive circuit for driving a transistor device.

BACKGROUND

Transistor devices are widely used as electronic switches for various types of loads in automotive, industrial, household or consumer electronic applications, to name only a view. There is a need to provide an integrated drive circuit with an adjustable drive characteristic and a minimum number of input and output pins.

SUMMARY

One example relates to an electronic circuit. The electronic circuit includes a first input pin configured to receive a first input signal that includes an enable information and at least one operation parameter information, a second input pin configured to receive a second input signal, and an output pin. A control circuit is configured to generate a drive signal based on the enable information included in the first input signal and the second input signal, and an output circuit is configured to generate an output signal at the output pin such that a timing of the output signal is dependent on the drive signal and at least one parameter of the output signal is dependent on the at least one operation parameter information included in the first input signal.

In another example, the electronic circuit includes a first input pin configured to receive a first input signal that includes an enable information and at least one operation parameter information, a second input pin configured to receive a second input signal, an output pin, a control circuit that is configured to generate a drive signal based on the first input signal and the second input signal such that the control circuit generates an on-level and an off-level of the drive signal dependent on a timing of the second input signal, an output circuit configured to generate an output signal at the output pin such that a timing of the output signal is dependent on the drive signal. The enable information includes an enabled state and a disabled state. The control circuit is configured to generate the drive signal when the enable information is in the enabled state and to turn to the electronic circuit off when the enable information is in the disabled state. The at least one operation parameter information includes information about an operational parameter of the output signal. The output circuit is configured to use the at least one operation parameter information to change the operational parameter of the output signal when the control circuit is generating the drive signal.

Another example relates to a method. The method includes receiving a first input signal that includes an enable information and an operation parameter information by a first input pin of an electronic circuit, and a second input signal by a second input pin of the electronic circuit; generating a drive signal based on the enable information in the first input signal and the second input signal by a control circuit of the electronic circuit; and generating an output signal by an output circuit at an output of the electronic circuit such that a timing of the output signal is dependent on the drive signal and at least one parameter of the output signal is dependent on the at least one operation parameter information included in the first input signal.

In another example, the method includes receiving a first input signal that includes an enable information and at least one operation parameter information by a first input pin of an electronic circuit, and a second input signal by a second input pin of the electronic circuit, generating a drive signal based on the first input signal and the second input signal such that the control circuit generates an on-level and an off-level of the drive signal dependent on a timing of the second input signal, and generating an output signal by an output circuit at an output of the electronic circuit such that a timing of the output signal is dependent on the drive signal. The enable information includes an enabled state and a disabled state. The control circuit generates the drive signal when the enable information is in the enabled state and turns the electronic circuit off when the enable information is in the disabled state. The at least one operation parameter information includes information about an operational parameter of the output signal. The output circuit uses the at least one operation parameter information to change the operational parameter of the output signal when the control circuit is generating the drive signal.

Those skilled in the art will recognize additional features and advantages upon reading the following detailed description, and on viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
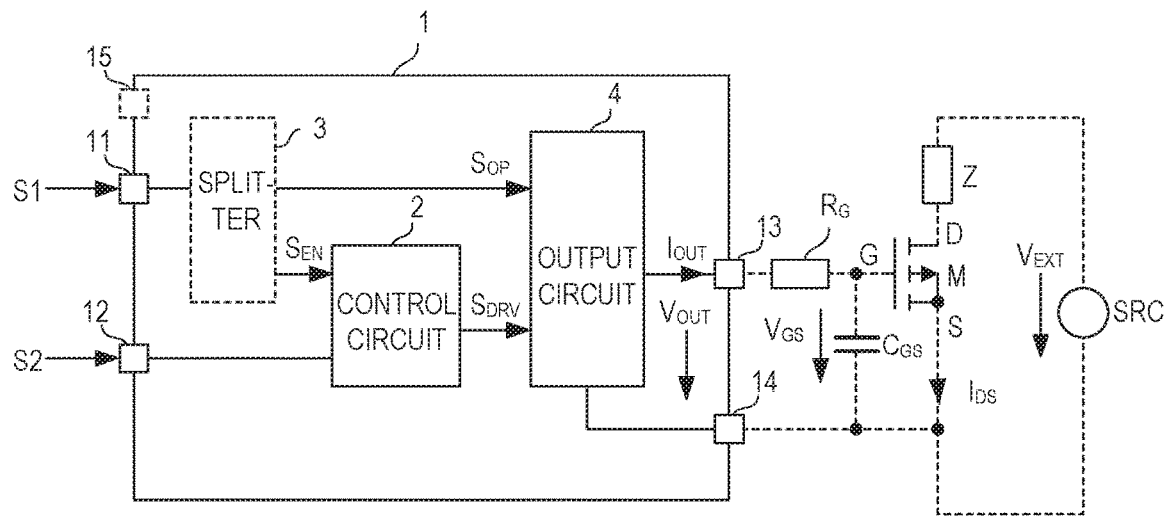
FIG. 1 shows a block diagram of an electronic circuit according to one example for driving a transistor device.

FIG. 1 shows a block diagram of an electronic circuit according to one example. This electronic circuit is configured to drive a transistor device, in particular, a field-effect controlled transistor device. For the purpose of explanation, a transistor device M that may be driven by the electronic circuit is illustrated in dashed lines in FIG. 1. Just for the purpose of illustration, this transistor device is illustrated as a MOSFET (Metal-Oxide Semiconductor Field-Effect Transistor), in particular, an n-type MOSFET. According to one example, the electronic circuit 1 is an integrated circuit. That is, the electronic circuit 1 is integrated in at least one semiconductor die (not shown) that is arranged in a semiconductor package (not shown).

Referring to FIG. 1, the electronic circuit 1 includes a first input pin 11 configured to receive a first input signal S1, a second input pin 12 configured to receive a second input signal S2 and an output pin 13 configured to generate at least one output signal. According to one example, the electronic circuit 1, at the output pin 13, generates an output current $I_{OUT}$ and an output voltage $V_{OUT}$, whereas the output voltage $V_{OUT}$ is a voltage referenced to a reference pin 14. Driving a MOSFET, such as the n-type MOSFET M shown in FIG. 1, by the electronic circuit 1 includes coupling a gate node G of the MOSFET M to the output pin 13 and coupling a source node S of the MOSFET M to the reference pin 14. A MOSFET, such as the n-type MOSFET M shown in FIG. 1, includes an internal gate-source capacitance between the gate node G and the source node S. For the purpose of illustration, this gate-source capacitance, in FIG. 1, is drawn as a capacitor $C_{GS}$ connected between the gate node G and the source node S of the MOSFET M. An operation state of the MOSFET M is dependent on a charging state of the gate-source capacitance $C_{GS}$. The MOSFET M is in an on-state, for example, if the gate-source capacitance $C_{GS}$ has been charged such that a voltage (gate-source voltage) $V_{GS}$ across the gate-source capacitance $C_{GS}$ is higher than a threshold voltage of the MOSFET M. Equivalently, the MOSFET M is an off-state if a voltage across the gate-source capacitance $C_{GS}$ is below the threshold voltage. The threshold voltage is dependent on the specific type and the specific design of the transistor device M.

The electronic circuit 1 is configured to drive the transistor device M in one of the on-state and the off-state. Driving the transistor device M in the on-state includes generating an output voltage $V_{OUT}$ between the output pin 13 and the reference pin 14 with a voltage level that is higher than the threshold voltage of the transistor device M. Equivalently, driving the transistor device M in the off-state includes generating the output voltage $V_{OUT}$ with a voltage level that is lower than the threshold voltage. The output voltage $V_{OUT}$ of the electronic circuit 1 finally defines the gate-source voltage $V_{GS}$ of the MOSFET M. "Finally" means that changes of the output voltage $V_{OUT}$ do not immediately result in changes of the gate-source voltage $V_{GS}$. Instead, changing the gate-source voltage $V_{GS}$ includes charging or discharging the gate-source capacitance $C_{GS}$. How fast the gate-source capacitance $C_{GS}$ can be charged or discharged and, therefore, how fast the gate-source voltage $V_G$s changes if the output voltage $V_{OUT}$ changes is dependent on the size of the gate-source capacitance $C_{GS}$ and the output current $I_{OUT}$ provided by the electronic circuit 1, whereas this output current $I_{OUT}$, in turn, may be dependent on an electrical resistance $R_G$ between the output node 13 and the gate node of the MOSFET M. This resistance $R_G$ may include inevitable line resistances of a connection line between the output node 13 and the gate node G and/or may include a discrete resistor deliberately added between the output node 13 and the gate node G.

A switching speed of the transistor device M, that is, how fast the transistor device M switches from the on-state to the off-state and vice versa, is dependent on at least one of (a) the maximum output current $I_{OUT}$, and (b) the output voltage $V_{OUT}$. Referring to FIG. 1, the transistor device M may be connected in series with a load Z, wherein a series circuit with the transistor device M and the load Z may be connected to a voltage source SRC that provides an external supply voltage $V_{EXT}$. The load Z can be any type of electric load or electronic circuit. In the on-state of the transistor device M, a load current $I_{DS}$ other than zero flows through the transistor device and the load Z. In the off-state, the transistor device M prevents the load current $I_{DS}$ to flow, in other words, the load current $I_{DS}$ is zero. The switching speed of the transistor device M, inter alia, defines how fast the load current $I_{DS}$ changes when the transistor device M changes its operation state, that is, when the transistor device changes from the on-state to the off-state or from the off-state to the on-state. Changes of the load current $I_{DS}$ may cause voltage spikes in inductances of the load circuit, which is the circuit including the transistor device M, the load Z and the external voltage source SRC. Those inductances may be parasitic inductances such as line inductances or inductances included in the load. In order to be able to use the electronic circuit 1 for driving a transistor device, such as transistor device M shown in FIG. 1, in a variety of different load circuits it is desirable to be able to adjust at least one operation parameter of the electronic circuit that influences the switching speed of the transistor device. This at least one operation parameter includes, for example, a current level of the output current $I_{OUT}$ and/or a voltage level of the output voltage. In the following. "output signal" denotes any of or both of the output current Iour and the output voltage $V_{OUT}$.

The electronic circuit shown in FIG. 1 is configured to receive a first input signal S1 that includes two types of information, an enable information and an operation parameter information. Based on the enable information, the electronic circuit 1 is enabled or disabled. If the electronic circuit 1 is enabled based on the first input signal S1, it generates the output signal such that a timing of the output signal $V_{OUT}$, $I_{OUT}$ is dependent on the second input signal S2. If the electronic circuit 1 is disabled, the output signal is generated such that it drives the transistor device M in the off-state or maintains the transistor device M in the off-state, respectively. Driving or maintaining the transistor device M in the off-state, if the electronic circuit 1 is disabled, is independent of the second input signal S2.

The operation parameter information included in the first input signal S1 is used by the electronic circuit 1 to adjust at least one operation parameter that affects the output signal. Thus, through the first input signal S1 at least one operation parameter of the electronic circuit can be adjusted in order to adjust a switching speed of the transistor device. By including the enable information and the operation parameter information in the first input signal S1 only one input pin of the electronic circuit 1 is required to receive both, the enable information and the operation parameter information. In FIG. 1, $S_{EN}$ denotes a signal obtained from the first input signal S1 that includes the enable information, and $S_{OP}$ denotes a signal obtained from the first input signal S1 that includes the operation parameter information. $S_{EN}$ is referred to as enable signal and $S_{OP}$ is referred to as operation parameter signal in the following. There are various ways for the first input signal S1 to include the enable information and the operation parameter information. Some examples of how this information may be included in the first input signal S1 are explained herein further below. How the enable signal $S_{EN}$ and the operation parameter signal $S_{OP}$ are obtained from the first input signal S1 is dependent on how the enable information and the operation parameter information are included in the first input signal S1. According to one example, the enable signal $S_{EN}$ and the operation parameter signal $S_{OP}$ are identical signals that are each identical with the first input signal S1. According to another example, an optional signal separator or splitter circuit 3 (illustrated in dashed lines in FIG. 1) generates the enable signal $S_{EN}$ and the operation parameter signal $S_{OP}$ from the first input signal S1.

Referring to FIG. 1, a control circuit 2 receives the enable signal $S_{EN}$ and the second input signal S2 and generates a drive signal $S_{DRV}$ based on the enable signal $S_{EN}$ and the second input signal S2. An output circuit 4 receives the drive signal $S_{DRV}$ and the operation parameter signal $S_{OP}$ and generates the output signal $V_{OUT}$, $I_{OUT}$ based on the drive signal $S_{DRV}$ and the operation parameter signal $S_{OP}$. In particular, the output circuit 4 is configured to generate in timing of the output signal $V_{OUT}$, $I_{OUT}$ based on the drive signal $S_{DRV}$ and the at least one operation parameter of the output signal $V_{OUT}$, $I_{OUT}$ based on the operation parameter signal $S_{OP}$. This function of the output stage 4 is illustrated in FIG. 2.

Figure 2:
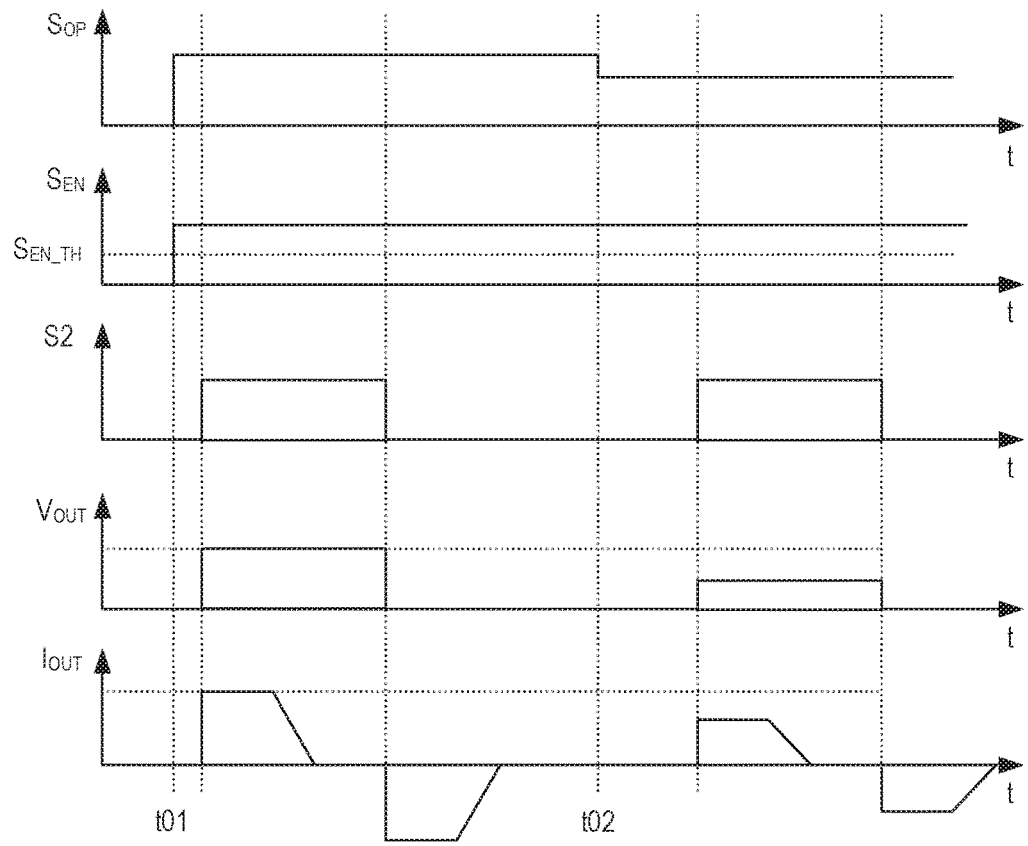
FIG. 2 shows timing diagrams that illustrate one way of operation of the electronic circuit shown in FIG. 1.

FIG. 2 shows timing diagrams of an example operation parameter signal $S_{OP}$, an example enable signal $S_{EN}$, an example second input signal S2, an example output voltage $V_{OUT}$ and an example output current $I_{OUT}$. Referring to FIG. 2, the enable signal $S_{EN}$ may have at least two different signal levels, a first level that enables the electronic circuit 1, and a second level that disables the electronic circuit 1. The first level is referred to as enable level and the second level is referred to as disable level in the following. In the example shown in FIG. 2, the enable level is a signal level higher than an enable threshold $S_{EN\_TH}$, and the disable level is a signal level below the enable threshold $S_{EN\_TH}$. This, however, is only an example. According to another example (not shown) the disable level is a high signal level and the enable level is a low signal level. In the example shown in FIG. 2, the signal level of the enable signal $S_{EN}$ changes from the disable level to the enable level at a time t01. After this time t01, that is, after the electronic circuit 1 has been enabled, a timing of the drive signal $S_{DRV}$ is dependent on the second input signal S2. According to one example, the second input signal S2 has an on-level or an off-level. The on-level indicates that it is desired to switch on the transistor device M and the off-level indicates that it is desired to switch off the transistor device M. If the electronic circuit 1 is enabled, that is, after time t01 in the example shown in FIG. 2, the drive signal $S_{DRV}$ has an on-level each time the second input signal S2 has an on-level, and the drive signal $S_{DRV}$ has an off-level each time the second input signal S2 has an off-level. An on-level of the drive signal $S_{DRV}$ indicates that it is desired to switch on the transistor device M, and an off-level indicates that it is desired to switch off the transistor device M. Just for the purpose of illustration, the on-level of the second input signal S2 and the drive signal $S_{DRV}$ is high signal level in the example shown in FIG. 2, and an off-level of these signals S2, $S_{DRV}$ is a low level in the example shown in FIG. 2. If the electronic circuit 1 disabled, the drive signal $S_{DR}$V has an off-level independent of a signal level of the second input signal S2.

Referring to the above, a timing of the output signal $V_{OUT}$, $I_{OUT}$ is dependent on the drive signal $S_{DRV}$. Thus, the output stage 4 is configured to generate the output signal $V_{OUT}$, Iour dependent on the drive signal $S_{DRV}$ such that the output signal switches on the transistor device M whenever the drive signal $S_{DRV}$ has an on-level and switches off the transistor device M whenever the drive signal $S_{DRV}$ has an off-level. In the example shown in FIG. 2, the output circuit 4 generates an on-level of the output voltage $V_{OUT}$ each time the drive signal $S_{DRV}$ has an on-level, and the output circuit 4 generates an off-level of the output voltage $V_{OUT}$ each time the drive signal $S_{DRV}$ has an off-level. The on-level of the output voltage $V_{OUT}$ is a voltage level higher than the threshold voltage of the transistor device M, and the off-level of the output voltage $V_{OUT}$ is a voltage level lower than the threshold voltage of the transistor device M. According to one example, the off-level of the output voltage $V_{OUT}$ is substantially zero. Referring to the above, switching on the transistor device M includes charging the gate-source capacitance $C_{GS}$ by the output current $I_{OUT}$, and switching off the transistor device M includes discharging the gate-source capacitance $C_{GS}$ by the output current $I_{OUT}$. The output current $I_{OUT}$ flows in a first direction when the gate-source capacitance $C_{GS}$ is being charged and in a second direction opposite the first direction when the output capacitance $C_{Gs}$ is being discharged. Referring to FIG. 2, the output current $I_{OUT}$ may decrease to zero during the on-state of the transistor device M and after the gate-source capacitance $C_{GS}$ has been charged to a voltage that substantially equals the output voltage $V_{OUT}$. Equivalently, the output current $I_{OUT}$ may decrease to zero after the gate-source capacitance $C_{GS}$ has been discharged in the off-state of the transistor device M.

Referring to the above, at least one of a current level of the output current Iour and a voltage level of the output voltage $V_{OUT}$ is dependent on the operation parameter signal $S_{OP}$. According to one example, the operation parameter signal $S_{OP}$ either adjusts the current level of the output current $I_{OUT}$ or the voltage level of the output voltage $V_{OUT}$, whereas these two parameters may be dependent on one another. If for, example, the output voltage $V_{OUT}$ decreases the output current Iour also decreases, and vice versa. This is schematically illustrated in FIG. 2 where a signal level of the operation parameter signal $S_{OP}$ at a time t02 changes from a first signal level to a second signal level. The first signal level of the operation parameter signal $S_{OP}$ is associated with a first current level of the output current Iour or a first voltage level of the output voltage $V_{OUT}$, and the second signal level of the operation parameter signal $S_{OP}$ is associated with a second current level of the output current Iour and/or a second voltage level of the output voltage $V_{OUT}$. According to one example, as shown in FIG. 2, the operation parameter signal $S_{OP}$ adjusts both, the current level of the output current $I_{OUT}$ at switching on and the current level of the output current Iour at switching off the transistor device M. According to another example, the operation parameter signal $S_{OP}$ adjusts the current level of the output current Iour only at one of switching on and switching off the transistor device M while the current level at the other one of switching on and switching off is fixed.

Figure 3:
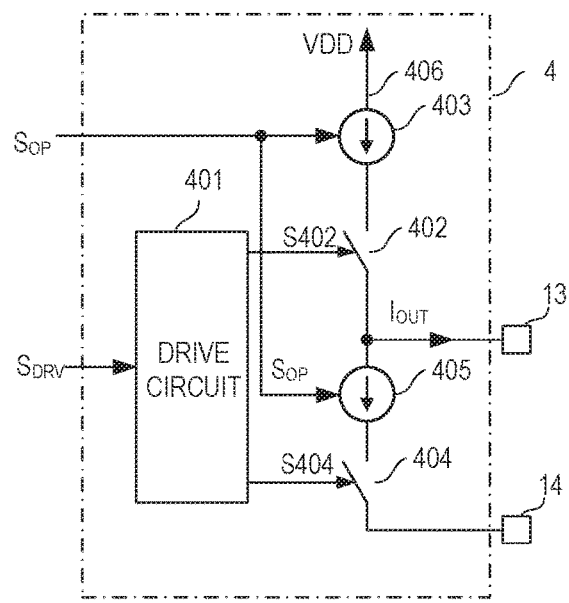
FIG. 3 shows an output circuit according to one example of the electronic circuit.

FIG. 3 illustrates one example of an output circuit 4 that is configured to generate the output voltage $V_{OUT}$ and the output current $I_{OUT}$ based on the operation parameter signal $S_{OP}$ and the drive signal $S_{DRV}$. The output circuit shown in FIG. 3 includes a first electronic switch 402 and a first controllable current source 403 connected between the output pin 13 and a supply node 406 where a supply potential VDD is available. According to one example, the supply potential VDD is referenced to the reference pin 14. VDD is also referred to as supply voltage in the following. According to one example, the supply node 406 is connected to a supply pin 15 (illustrated in dashed lines in FIG. 1) of the electronic circuit 1 where the supply potential VDD may be received from an external voltage VDD (not shown). In the output circuit 4 shown in FIG. 3, a second electronic switch 404 is connected in series with a second current source 405, wherein a series circuit with the second electronic switch 404 and the second current source 405 is connected between the output pin 13 and the reference pin 14. A drive circuit 401 is configured to drive the first electronic switch 402 and the second electronic switch 404 dependent on the drive signal $S_{DRV}$.

Figure 4:
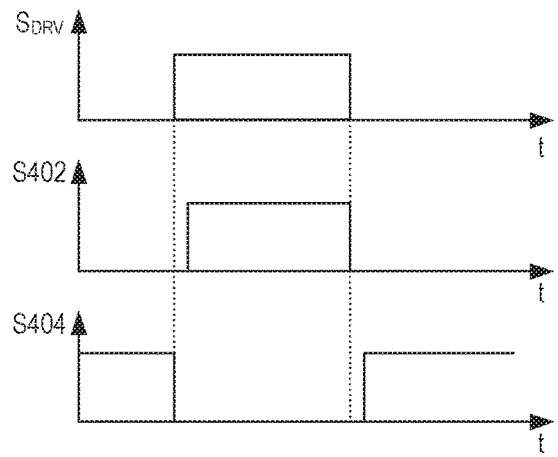
FIG. 4 shows timing diagrams that illustrate one way of operation of the output circuit shown in FIG. 3.

One way of operation of the output circuit shown in FIG. 3 is illustrated in FIG. 4 that illustrates timing diagrams of the drive signal $S_{DRV}$, a control signal S402 received by the first electronic switch 402 from the drive circuit 401, and a second control signal S404 received by the second electronic switch 404 from the drive circuit 401. Each of the first control signal S402 and the second control signal S404 either has an on-level that switches on the respective switch 402, 404 or an off-level that switches off the respective switch 402, 404. Just for the purpose of illustration, the on-level is a high signal level in the example shown in FIG. 4 and the off-level is a low signal level in the example shown in FIG. 4. Referring to FIG. 4, the drive circuit 401 generates the first control signal S402 and the second control signal S404 based on the drive signal $S_{DRV}$ such that the first electronic switch 402 is switched on when the drive signal $S_{DRV}$ has an on-level and is switched off, when the drive signal $S_{DRV}$ has an off-level. Optionally, as shown in FIG. 4, there is a dead time between switching off (by an off-level of the respective control signal) one of the first electronic switch 402 and the second electronic switch 404 and switching on (by an on-level of the respective control signal) the other one of the first electronic switch 402 and the second electronic switch 404. This dead time may help to prevent a cross current.

In the output circuit 4 shown in FIG. 3, the output voltage $V_{OUT}$ substantially equals the supply voltage VDD when the first electronic switch 402 is switched on and substantially is zero when the second electronic switch 404 is switched on. A current level of the output current $I_{OUT}$ is defined by the first current source 403 when the first electronic switch 402 is switched on, that is, when the transistor device M (not shown in FIG. 3) is to be switched on, and by the second current source 405 when the second electronic switch 404 is switched on, that is, when the transistor device M (not shown in FIG. 3) is to be switched off. At least one of these current levels is dependent on the operation parameter signal $S_{OP}$, that is, at least one of the first and second current sources 403, 405 is controlled by the operation parameter signal $S_{OP}$. In the example, shown in FIG. 3, both of the first current source and the second current source are controlled by the operation parameter signal $S_{OP}$ so that the output current level at switching on and switching off can be adjusted. According to another example, only one of these current sources 403, 405 such as the first current source 403 is a controllable current source while the other one of these current sources 403, 405 is a constant current source.

According to one example, the first current source 403 and the second current source 405 receive the same operation parameter signal $S_{OP}$ so that, for example, the output current level at switching on equals the output current level at switching off. According to another example (not shown), the first input signal S1 includes a first operation parameter information based on which a first operation parameter signal is generated in the electronic circuit 1, and a second operation parameter information based on which a second operation parameter signal is generated in the electronic circuit 1. The first operation parameter signal is received by the first current source 403 and the second operation parameter signal is received by the second current source 405. In this way different current levels of the of the output current Iour at switching and at switching off can be generated.

Figure 5:
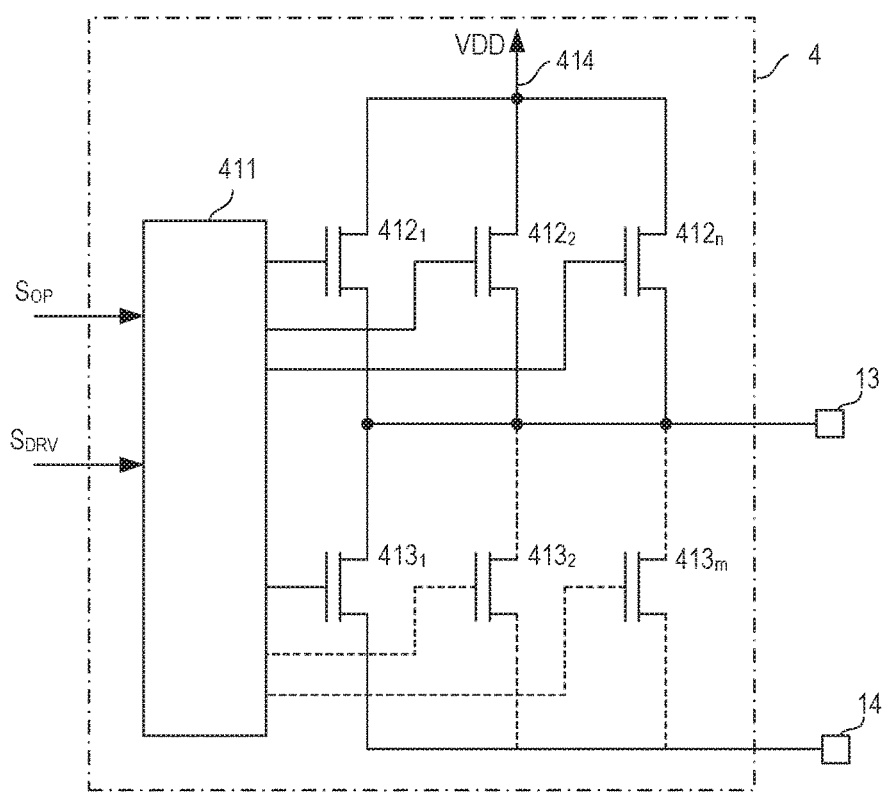
FIG. 5 shows an output circuit according to another example.

FIG. 5 shows an output circuit 4 according to another example. In this example, the output circuit includes a plurality of first transistors $412_1$, $412_2$, $412_n$ that have their load paths connected in parallel between a supply node 414 where a supply potential VDD is available and the output pin 13. At least one further transistor $413_1$ is connected between the output pin 13 and the reference pin 14. The transistors $412_1$-$412_n$, $413_1$ are driven by a drive circuit 411 dependent on the drive signal $S_{DRV}$ and the operation parameter signal $S_{OP}$. In order to switch on the transistor device M (not shown in FIG. 5) dependent on the drive signal $S_{DRV}$ the control circuit 411 switches on at least one of the first transistors $412_1$-$412_n$. In order to switch off the transistor device M, the control circuit 411 switches on the at least one second transistor device $413_1$. In the output circuit 4 shown in FIG. 5, the current level of output current $I_{OUT}$ for driving the transistor device M in the on-state can be adjusted by switching on one or more of the first transistor devices $412_1$-$412_n$.

According to one example, the individual first transistor devices $412_1$-$412_n$ substantially have the same transistor size so that a current through each of these transistor devices $412_1$-$412_n$ in the on-state is substantially the same. In this example, the drive circuit 411 is configured to select, dependent on the operation parameter signal $S_{OP}$, the number of first transistor devices $412_1$-$412_n$ that are switched on when the drive signal $S_{DRV}$ has an on-level. In this way, the current level of the output current is dependent on the operation parameter signal $S_{OP}$.

According to another example, the first transistor devices $412_1$-$412_n$ have different transistor sizes. In this case, the drive circuit 411 is configured to select, dependent on the operation parameter signal $S_{OP}$, which of first transistor devices $412_1$-$412_n$ is/are switched on when the drive signal $S_{DRV}$ has an on-level. In this way, the current level of the output current $I_{OUT}$ is adjusted dependent on the operation parameter signal $S_{OP}$.

Figure 6:
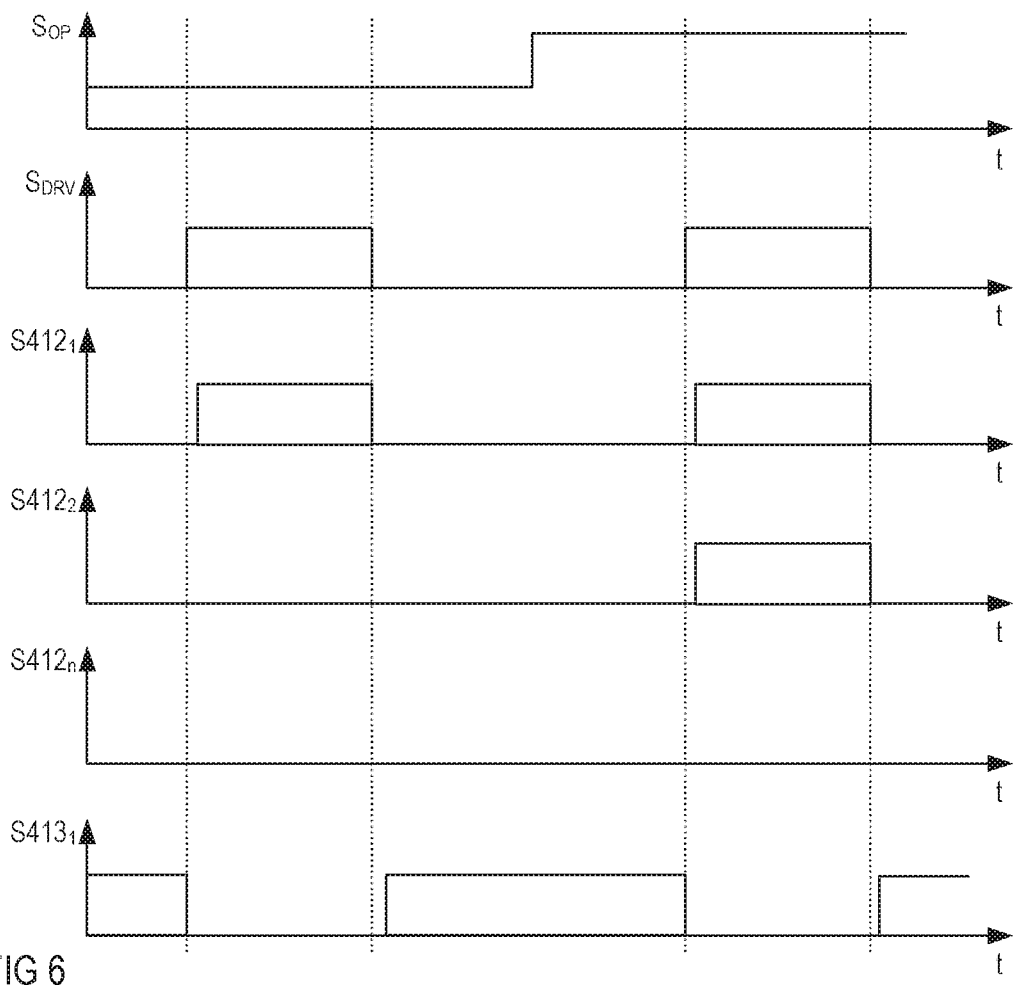
FIG. 6 shows timing diagrams that illustrate one way of operation of the output circuit shown in FIG. 5.

The function of the drive circuit 411 to drive the first transistor devices $412_1$-$412_n$ and the at least one second transistor device $413_1$ based on the drive signal $S_{DRV}$ and the operation parameter signal $S_{OP}$ is illustrated in FIG. 6 that shows example timing diagrams of the operation parameter signal $S_{OP}$, of the drive signal $S_{DRV}$, of drive signals S$412_1$, S$412_2$, S$412_n$ of the first transistor devices $412_1$, $412_2$, $412_n$, and of a drive signal S$413_1$ of the at least one second transistor device. Referring to the above, the control circuit 411 switches on at least one of the first transistor devices $412_1$-$412_n$ when the drive signal $S_{DRV}$ has an on-level in order to switch on the transistor device M. When the drive signal $S_{DRV}$ has an off-level, the control circuit 411 switches on the at least one second transistor device $413_1$. According to one example, as shown in FIG. 6, there is a dead time between switching off the at least one second transistor device $413_1$ and one or more of the first transistor devices $412_1$-$412_n$ and between switching off one or more of the first transistor devices $412_1$-$412_n$ and switching on the at least one second transistor device $413_1$. In the example shown in FIG. 6, the operation parameter signal $S_{OP}$ changes its signal level at a time t03. Driving the first transistor devices $412_1$-$412_n$ dependent on the operation parameter signal $S_{OP}$ is illustrated in FIG. 6 in that before time t03 only first transistor device $412_1$ is switched on when the drive signal $S_{DRV}$ has an on-level, while after t03 two, namely, transistor devices $412_1$ and $412_2$ are switched on when the drive signal $S_{DRV}$ has an on-level so that the output current Iour is higher after t03. This, however, is only an example to illustrate the function of the control circuit 411.

Optionally, two or more second transistor devices (illustrated in dashed lines in FIG. 5) are connected between the output pin 13 and the reference pin 14. In this example, the control circuit 411 is configured not only to select one or more of the first transistor devices $412_1$-$412_n$ based on the operation parameter signal $S_{OP}$, but also to select one or more of the second transistor devices $413_1$-$413_m$ based on the operation parameter signal $S_{OP}$. In this example, the output current level can be adjusted not only when driving the transistor device M in the on-state but also when driving the transistor device M in the off-state.

Figure 7:
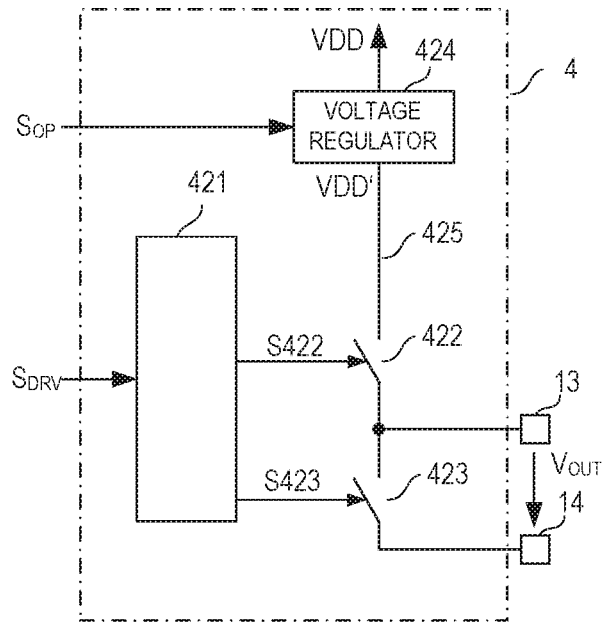
FIG. 7 shows an output circuit according to another example.

FIG. 7 shows an output circuit 4 according to another example. In this example, a voltage regulator 424 receives the supply voltage VDD and generates an output voltage VDD' based on the operation parameter signal $S_{OP}$ from the supply voltage VDD. A first electronic switch 422 is connected between a circuit node 425 where the output voltage VDD' is available and the output pin 13, and a second electronic switch 423 is connected between the output pin 13 and the reference pin 14. A drive circuit 421 drives the first electronic switch 422 and the second electronic switch 423 based on the drive signal $S_{DRV}$, whereas the control circuit 421 switches on the first electronic switch 422 when the drive signal $S_{DRV}$ has an on-level and switches on the second electronic switch 423 when the drive signal $S_{DRV}$ has an on-level. According to one example, and as explained with reference to FIG. 4, there may be a dead time between switching off one of the first and second electronic switch 422, 423 and switching on the other one of the first and second electronic switch 422, 423.

In the output circuit shown in FIG. 7, the output voltage VDD' of the voltage regulator is dependent on the operation parameter signal $S_{OP}$. This voltage regulator output voltage VDD' substantially equals the output voltage $V_{OUT}$ when the first electronic switch 422 is in the on-state, that is, when the transistor device M (not shown in FIG. 7) is to be switched on. Thus, in this example, the output voltage $V_{OUT}$ can be adjusted dependent on the operation parameter signal $S_{OP}$. In this example, the (maximum) current level of the output current Iour is dependent on the voltage regulator voltage VDD' and an electrical resistance (such as resistance $R_G$ shown in FIG. 1) between the first switch 422 and the gate node of the transistor device M, whereas the current level decreases as the voltage regulator voltage VDD' decreases, and vice versa. Thus, in the output circuit shown in FIG. 7, the output current Iour can be adjusted by adjusting the output voltage VDD' based on the operation parameter signal $S_{OP}$ received by the voltage regulator.

Of course, a voltage generator as shown in FIG. 7 may also be used in output circuits of the type shown in FIGS. 3 and 5. By this, output circuits are obtained in which not only the output current level but also the output voltage $V_{OUT}$ can be adjusted.

As mentioned above, there is a variety of different ways to include the enable information and the at least one operation parameter information in the first input signal S1. Some examples of how this information can be included in the first input signal S1 are explained in the following.

Figure 8:
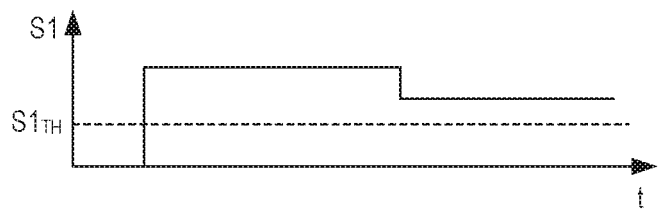
FIG. 8 shows a timing diagram of an input signal according to one example that carries an enable information and at least one operation parameter information.

FIG. 8 shows a timing diagram of a first input signal S1 according to a first example. In this example, the enable information and the operation parameter information are included in the signal level (amplitude) of the first input signal S1. The signal level of the first input signal S1 is either lower than a threshold $S1_{TH}$ or higher than the threshold. In this first input signal S1, the enable information is included in a relationship between the signal level and the threshold $S1_{TH}$. For example, the first input signal S1 disables the electronic circuit 1 if the signal level is lower than the threshold $S1_{TH}$ and enables the electronic circuit 1 if the signal level is higher than the threshold $S1_{TH}$. According to one example, as shown in FIG. 8, the first input signal S1 does not include an operation parameter information if the signal level is lower than the threshold. According to another example (not shown) the first input signal S1 includes an operation parameter information when the signal level is lower than the threshold so as to already provide an operation parameter information to the electronic circuit before the electronic circuit is enabled. When the signal level is higher than threshold, the operation parameter information is included in the signal level (the amplitude) of the first input signal. That is, the signal level is modulated dependent on the operation parameter information, whereas in the example shown in FIG. 8 only two different signal levels higher than the threshold are illustrated. One of these signal levels may represent a first value of an operation parameter, such as a current level of the output current or a voltage level of the output voltage, and the other one of these signal levels may represent a second value of the respective operation parameter. According to another example, each signal level represents values of two or more different operation parameters. For example, a first signal level represents a first value of a first operation parameter and a second value of a second operation parameter, and a second signal level represents a third value of the first operation parameter and a fourth value of the second operation parameter.

Figure 9:
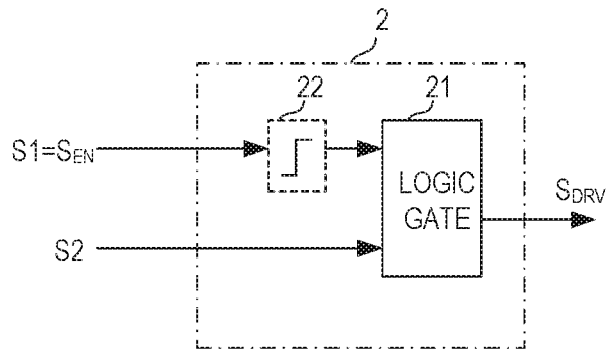
FIG. 9 shows one example of a control circuit of the electronic circuit.

FIG. 9 shows one example of a control circuit 2 that is configured to generate the drive signal $S_{DRV}$. In this example, a first input signal S1 of the type shown in FIG. 8 is used as the enable signal $S_{EN}$ so that the control circuit 2 receives the first input signal S1 and the second input signal S2 and is configured to generate the drive signal $S_{DRV}$ based on these signals S1, S2. The second input signal is a signal of the type shown in FIG. 2, for example. Referring to FIG. 9, the control circuit 2 includes a logic gate 21 that receives the first input signal S1 and the second input signal S2 and is configured to generate an on-level of the drive signal $S_{DRV}$ only if the second input signal S2 has an on-level and if the first input signal S1 has an enable level, that is, if the first input signal is higher than the threshold. The logic gate 21 generates an off-level of the drive signal $S_{DRV}$ if the second input signal S2 has an off-level and/or if the first input signal S1 is below the threshold $S1_{TH}$.

In the example shown in FIG. 9, the logic gate 21 receives the first input signal S1 with the varying signal level (amplitude) whereas the logic gate 21 only detects whether the signal level is lower or higher than the threshold $S1_{TH}$. Optionally, a threshold detector 22 receives the first input signal S1, compares the first input signal S1 with a threshold that corresponds to the threshold $S1_{TH}$ and outputs a logic signal to the logic gate 21 dependent on this comparison. In this case, the logic gate 21 receives the second input signal S2 and a logic signal from the threshold detector 22 and is configured to generate an on-level of the drive signal $S_{DRV}$ only if the second input signal S2 has an on-level and the logic signal output by the threshold detector 22 indicates that the first input signal S1 is higher than the threshold $S1_{TH}$.

A first input signal S1 of the type shown in FIG. 8 may be used by the output circuit 4 as the operation parameter signal S1. In this case, the output circuit adjusts the at least one operation parameter based on the signal level (amplitude) of the first input signal.

Figure 10:
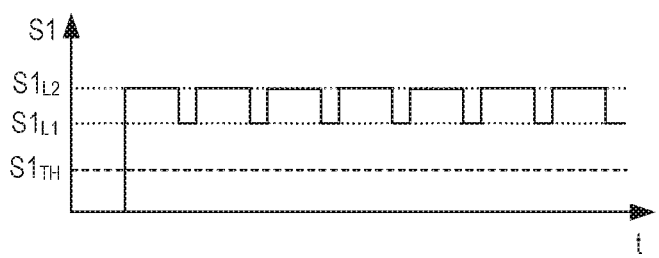
FIG. 10 shows a timing diagram of an input signal according to another example that carries an enable information and at least one operation parameter information.

FIG. 10 shows a timing diagram of a first input signal S1 according to another example. Like the first input signal S1 shown in FIG. 8 the first input signal shown in FIG. 10 disables the electronic circuit 1 if the signal level is below the threshold $S1_{TH}$ and enables the electronic circuit 1 if the signal level is above the threshold $S1_{TH}$. Furthermore, the first input signal S1 shown in FIG. 10 carries an operation parameter information only if the signal level is above the threshold $S1_{TH}$. The first input signal S1 shown in FIG. 10 is different from the input signal S1 shown in FIG. 8 in that the operation parameter is not included in the amplitude (the signal level) of the first input signal S1. Instead, the operation parameter information is included in a sequence of high and low signal pulses. Low signal pulses have a first level $S1_{L1}$ and high signal pulses have a second level $S1_{L2}$ higher than the first level in this example. The at least one operation parameter information may be included in the pulse sequence in various ways, some of which are explained below.

According to one example, the pulse sequence is a pulse-width modulated (PWM) sequence in which a duty cycle carries the at least one operation parameter information. In this case, the pulse sequence includes a plurality of timely successive signal periods that each include a high pulse followed by a low pulse, wherein a duration of each of these signal periods is fixed. The duty cycle is given by the duration of the high pulses relative to the duration of the signal period (which includes a high pulse and a low pulse). An example of a PWM sequence is shown in FIG. 10.

According to another example, the pulse sequence is a frequency modulated (FM) sequence in which a frequency at which high pulses or low pulses occur carries the at least one operation parameter information. In this case, the pulse sequence includes a plurality of timely successive signal periods that each include a high pulse followed by a low pulse. A duration of each of these signal periods which is a reciprocal of the frequency is variable and, in this way, carries the at least one operation parameter information.

According to another example, the pulse sequence is a pulse code modulated (PCM) sequence in which a signal pattern in which high pulses and low pulses occur carries the at least one operation parameter information. In this case, the pulse sequence includes a plurality of high pulses of a fixed duration and a plurality of low pulses of a fixed duration, which may be identical with or different from the duration of the high pulses. According to one example, a predefined number of signal pulses forms one signal pattern.

Figure 11:
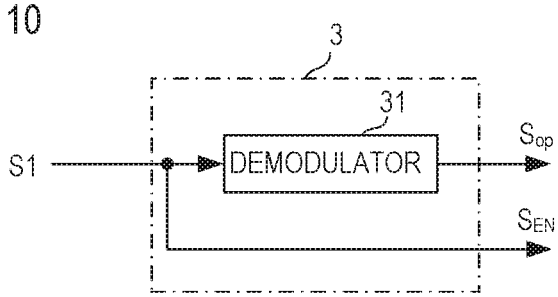
FIG. 11 shows one example of a splitter circuit of the electronic circuit.

The operation parameter information included in a first input signal S1 of the type shown in FIG. 10 may be retrieved from the first input signal S1 using a demodulator. This is illustrated in FIG. 11 that shows one example of a splitter circuit 3 that is configured to receive the first input signal S1 and generate the operation parameter signal $S_{OP}$ and the enable signal $S_{EN}$ based on the first input signal S1. The demodulator circuit 31 is configured to extract the operation parameter information from the modulated first input signal S1 by demodulating the first input signal. That is the demodulator reverses the modulation that was used (by an external modulator, not shown in the drawings) to modulate the first input signal based on the at least one operation parameter information in order to obtain the at least one operation parameter information and generates the operation parameter signal $S_{OP}$ such that it represents the operation parameter information. The enable signal $S_{EN}$ may be identical to the first input signal S1 in this example. The control circuit 2 may be implemented as explained with reference to FIG. 9.

Figure 12:
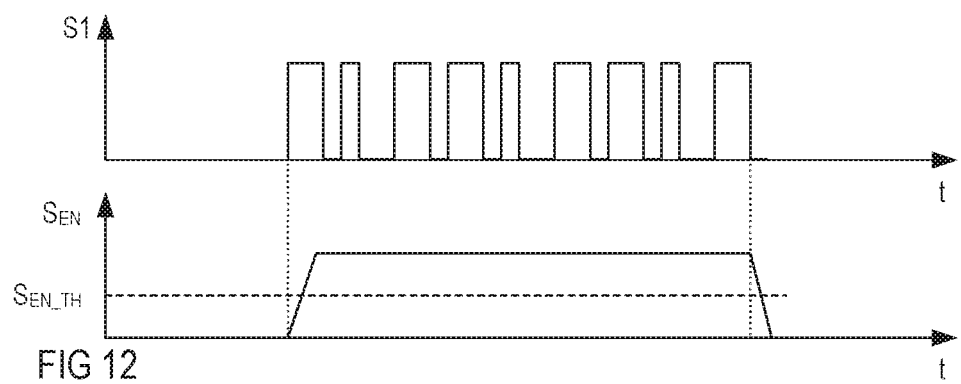
FIG. 12 shows a timing diagram of an input signal according to another example that carries an enable information and at least one operation parameter information.

FIG. 12 shows a first input signal S1 according to another example. In this example, the first input signal S1 only has two different signal levels, a low level and a high level. To disable the electronic circuit 1, the first input signal S1 has one of the low level and the high level longer than a predefined time period. According to one example, the low level of the first input signal S1 disables the electronic circuit if the low level prevails longer than a predefined time period. The first input signal S1 enables the electronic circuit 1 when it includes a sequence of high and low signal pulses. Low signal pulses have the low level explained above and high signal pulses have the high level explained above. This pulse sequence furthermore includes the at least one operation parameter information. The pulse sequence may be a PWM sequence, a FM sequence or a PCM sequence so that, as explained with reference to FIG. 10, the at least one operation parameter information is included in a duty cycle, a frequency or a signal pattern of the pulse sequence.

Figure 13:
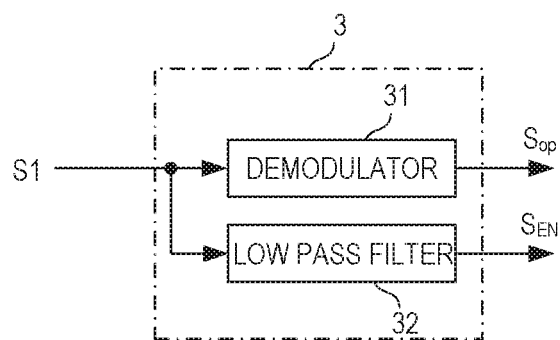
FIG. 13 shows a control circuit according to another example.

A splitter circuit 3 configured to receive a first input signal S1 of the type shown in FIG. 12 and to generate the operation parameter signal $S_{OP}$ and the enable signal $S_{EN}$ based on this first input signal S1 is shown in FIG. 13. Besides a demodulator 31 already explained with reference to FIG. 11, the splitter circuit 3 includes a low pass filter 32 that receives the first input signal S1 and generates the enable signal $S_{EN}$. An enable signal $S_{EN}$ generated by the filter 32 based on the first input signal S1 shown in FIG. 12 is also illustrated in FIG. 12. The enable signal $S_{EN}$ is a signal that has a signal level higher than a threshold $S_{EN\_TH}$ as long as signal pulses in the first input signal S1 occur, that is, as long as the electronic circuit 1 is to be enabled. By virtue of the low pass filter, there is a short delay time between the beginning of a first signal pulse of the first input signal S1 and a rising edge of the enable signal $S_{EN}$, and a short delay time between the falling edge of a last signal pulse of the pulse train in the first input signal S1 and the falling edge of the enable signal $S_{EN}$. This delay time, however, is usually acceptable.

Figure 14:
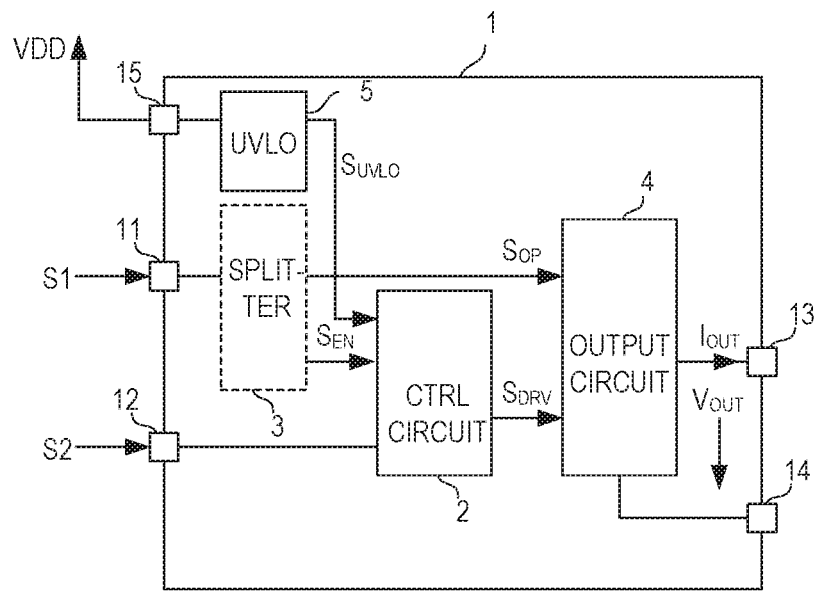
FIG. 14 shows a block diagram of an electronic circuit according to another example.

FIG. 14 shows an electronic circuit 1 according to another example. In this example, the electronic circuit 1 includes an under voltage lockout (UVLO) circuit 5 that receives the supply voltage VDD and generates an UVLO signal $S_{UVLO}$. The control circuit 1 receives the UVLO signal $S_{UVLO}$ and is configured to switch off the transistor device M by setting the drive signal $S_{DRV}$ to an off-level as soon as the UVLO signal $S_{UVLO}$ indicates that the supply voltage VDD has fallen below a predefined supply voltage threshold.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronic circuit, comprising:
   a first input pin configured to receive a first input signal that includes an enable information and at least one operation parameter information;
   a second input pin configured to receive a second input signal;
   an output pin;
   a control circuit that is configured to generate a drive signal based on the first input signal and the second input signal such that the control circuit generates an on-level and an off-level of the drive signal dependent on a timing of the second input signal;
   an output circuit configured to generate an output signal at the output pin such that a timing of the output signal is dependent on the drive signal;
   wherein the enable information comprises an enabled state and a disabled state,
   wherein the control circuit is configured to generate the drive signal when the enable information is in the enabled state and to turn the electronic circuit off when the enable information is in the disabled state, and
   wherein the at least one operation parameter information comprises information about an operational parameter of the output signal, and
   wherein the output circuit is configured to use the at least one operation parameter information to change the operational parameter of the output signal when the control circuit is generating the drive signal,
   wherein the enable information is a magnitude threshold of the first input signal, wherein the at least one operation parameter information is a magnitude level of the first input signal, wherein the control circuit is configured to enable the electronic circuit when the first input signal is above the magnitude threshold and disable the electronic circuit when the first input signal is below the magnitude threshold, and wherein the output circuit is configured to change the operational parameter of the output signal based upon a change in the first input signal that does not cross the magnitude threshold.

2. The electronic circuit of claim 1, wherein the at least one operation parameter comprises a signal level of the output signal.

3. The electronic circuit of claim 2, wherein the output signal comprises an output current.

4. The electronic circuit of claim 2, wherein the output signal comprises an output voltage.

5. The electronic circuit of claim 1, wherein the output circuit comprises:
   a controllable current source configured to provide a current with a current level that is dependent on the at least one operation parameter information; and
   a circuit configured to connect the controllable current source to the output pin dependent on the drive signal.

6. The electronic circuit of claim 1, wherein the output circuit comprises:
   a plurality of transistor devices connected in parallel between a supply node and the output pin; and
   a drive circuit configured to select at least one of the plurality of transistors dependent on the at least one operation parameter information and drive the at least one selected transistor based on the drive signal.

7. The electronic circuit of claim 1, wherein the output circuit comprises:
a voltage regulator configured to generate a voltage with a voltage level that is dependent on the at least one operation parameter information; and
a circuit configured to connect the voltage regulator to the output pin dependent on the drive signal.

8. The electronic circuit of claim 1, further comprising:
a splitter circuit configured to receive the first input signal and generate an operation parameter signal representing the at least one operation parameter information, wherein the operation parameter signal is received by the output circuit.

9. The electronic circuit of claim 8, wherein the splitter circuit is further configured to generate an enable signal representing the enable information, and wherein the enable signal is received by the control circuit.

10. The electronic circuit of claim 1, wherein the magnitude threshold is a current or voltage of the first input signal, and wherein the operation parameter information changes the current or voltage of the first input signal without crossing the magnitude threshold.

11. A method, comprising:
receiving a first input signal that includes an enable information and at least one operation parameter information by a first input pin of an electronic circuit, and a second input signal by a second input pin of the electronic circuit;
generating a drive signal by a control circuit based on the first input signal and the second input signal such that the control circuit generates an on-level and an off-level of the drive signal dependent on a timing of the second input signal; and
generating an output signal by an output circuit at an output of the electronic circuit such that a timing of the output signal is dependent on the drive signal,
wherein the enable information comprises an enabled state and a disabled state,
wherein the control circuit generates the drive signal when the enable information is in the enabled state and turns the electronic circuit off when the enable information is in the disabled state, and
wherein the at least one operation parameter information comprises information about an operational parameter of the output signal, and
wherein the output circuit uses the at least one operation parameter information to change the operational parameter of the output signal when the control circuit is generating the drive signal,
wherein the enable information is a magnitude threshold of the first input signal, wherein the at least one operation parameter information is a magnitude level of the first input signal, wherein the control circuit enables the electronic circuit when the first input signal is above the magnitude threshold and disables the electronic circuit when the first input signal is below the magnitude threshold, and wherein the output circuit changes the operational parameter of the output signal based upon a change in the first input signal that does not cross the magnitude threshold.

12. The method of claim 11, wherein the at least one operation parameter comprises a signal level of the output signal.

13. The method of claim 12, wherein the output signal comprises an output current.

14. The method of claim 12, wherein the output signal comprises an output voltage.

15. The method of claim 11, wherein generating the output signal comprises:
providing, at the output pin and dependent on the drive signal, a current with a current level that is dependent on the at least one operation parameter information.

16. The method of claim 11, wherein generating the output signal comprises:
selecting at least one of a plurality of transistors that are connected in parallel between a supply node and the output pin; and
driving the at least one selected transistor based on the drive signal.

17. The method of claim 11, wherein generating the output signal comprises:
generating a voltage with a voltage level that is dependent on the at least one operation parameter information at the output pin dependent on the drive signal.

18. The method of claim 11, further comprising:
generating an operation parameter signal representing the at least one operation parameter information from the input signal; and
receiving the operation parameter signal by the output circuit.

19. The method of claim 18, further comprising:
generating an enable signal representing the enable information from the input signal; and
receiving the enable signal by the control circuit.

20. The method of claim 11, wherein the magnitude threshold is a current or voltage of the first input signal, and wherein the operation parameter information changes the current or voltage of the first input signal without crossing the magnitude threshold.

\* \* \* \* \*

UNITED STATES PATENT AND TRADEMARK OFFICE
CERTIFICATE OF CORRECTION

PATENT NO. : 10,901,449 B2
APPLICATION NO. : 16/714088
DATED : January 26, 2021
INVENTOR(S) : T. Gerber et al.

Page 1 of 1

It is certified that error appears in the above-identified patent and that said Letters Patent is hereby corrected as shown below:

On the Title Page

Column 2, abstract (Line 11), please change "turn to the" to -- turn the --.

Signed and Sealed this
Eleventh Day of May, 2021

Drew Hirshfeld
*Performing the Functions and Duties of the
Under Secretary of Commerce for Intellectual Property and
Director of the United States Patent and Trademark Office*